(12) United States Patent
Han (10) Patent No.: US 7,400,145 B2
(45) Date of Patent: Jul. 15, 2008

(54) SYSTEMS, METHODS AND APPARATUS FOR MULTI-SLICE QUANTITATIVE IMAGING

(75) Inventor: Eric Tzguang Han, Mountain View, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/566,677

(22) Filed: Dec. 4, 2006

(65) Prior Publication Data

US 2008/0130973 A1 Jun. 5, 2008

(51) Int. Cl.
*G01V 3/00* (2006.01)
(52) U.S. Cl. ........................ 324/307; 324/309
(58) Field of Classification Search ......... 324/300–322; 600/407–455
See application file for complete search history.

(56) References Cited

U.S. PATENT DOCUMENTS

| | | | |
|---|---|---|---|
| 5,420,510 A * | 5/1995 | Fairbanks et al. | 324/309 |
| 6,831,459 B2 * | 12/2004 | Szyperski et al. | 324/309 |
| 6,888,348 B2 * | 5/2005 | Kupce | 324/307 |

OTHER PUBLICATIONS

Arijitt Borthakur, PhD, Andrew Wheaton, BS, Sridhar, R. Charagundla, MD, PhD, Erik M. Shapiro, PhD, Ravinder R. Regatte, PhD, Sarma V. S. Akella, PhD, J. Bruce Kneeland, MD, and Ravinder Reddy, PhD; Three-Dimensional T1P-Weighted MRI at 1.5 Tesla; Journal of Magnetic Resonance Imaging, 2003, pp. 730-736; vol. 17.
Warren D. Foltz, Naeem Merchant, Eugene Downar, Jeff A. Stainsby, and Graham A. Wright; Coronary Venous Oximetry Using MRI; Magnetic Resonance in Medicine 42:837-848 (1999).
X. Li, E. T. Han, J. C. Crane, T. M. Link, B. Ma, G. Blumenkrantz, K. Keshari, D. C. Newitt, S. Majumdar; Development of in vivo multi-slice spiral T1rho mapping in cartilage at 3T and its application to osteoarthritis; ISMRM, 2005.
Xiaojuan Li, Eric T. Han, C. Benjamin Ma, Thomas M. Link, David C. Newitt, and Sharmila Majumdar1; In Vivo 3T Spiral Imaging Based Multi-Slice T1 Mapping of Knee Cartilage in Osteoarthritis; Magnetic Resonance in Medicine 54:929-936 (2005).
Andrew J. Wheaton, Arijitt Borthakur, Sridhar R. Charagundla, and Ravinder Reddy; Pulse Sequence for Multislice T1P-Weighted MRI; Magnetic Resonance in Medicine 51:362-369 (2004).
G.A. Wright, J.H. Brittain and J.A. Stainsby; Preserving T1 and T2 Contrast in Magnetization and Preparation Sequences; ISMRM; p. 1474; 1996.

* cited by examiner

*Primary Examiner*—Brij B Shrivastav
(74) *Attorney, Agent, or Firm*—Peter Vogel, Esq.; Michael G. Smith, Esq.

(57) ABSTRACT

Systems, methods and apparatus are provided through which multi-slice acquisitions of T1ρ-weighted data are combined to form quantitative T1ρ values without retrospective correction for the contaminating effects of other MR relaxation parameters.

20 Claims, 10 Drawing Sheets

|  | Controls (n=9) | OA Patients (n=5) | P-value |
|---|---|---|---|
| Femoral | 45.6±4.56 | 57.0±1.71 | 0.003 |
| Patellar | 44.1±4.46 | 47.8±7.68 | 0.43 |

FIG. 10

SYSTEMS, METHODS AND APPARATUS FOR MULTI-SLICE QUANTITATIVE IMAGING

FIELD OF THE INVENTION

This invention relates generally to magnetic resonance imaging, and more particularly to two dimensional multi-slice imaging.

BACKGROUND OF THE INVENTION

Magnetic resonance imaging (MRI) is a technique in which an object is placed in a magnetic field and subjected to pulses of the electromagnetic field at a frequency. Conventional MRI systems include a main magnet which generates a strong static magnetic field of a high temporal stability and a high spatial homogeneity within a field-of-view (FOV) where the imaging takes place. Conventional MRI systems also include a gradient coil assembly located in the bore between the main magnet and the RF coil and generating space-varying fields. The gradient coil assembly causes the response frequency and phase of the nuclei of the patient body to depend upon position within the FOV thus providing a spatial encoding of the body-emitted signal. Conventional MRI systems further include RF coil/coils arranged within the bore which emit RF waves and receive resonance signal from the body. The superconducting main magnet is typically used to achieve high field strength; the superconducting main magnet comprises a plurality of concentric coils placed inside a cryostat which is designed to provide a low temperature operating environment for superconducting coils.

MR imaging is used in diagnosis of a wide variety of medical conditions, including osteoarthritis (OA). Existing and emerging osteoarthritis treatments require early detection of the disease. Unfortunately, there are no established non-invasive diagnostic tools for the early detection of OA or for monitoring the effectiveness of OA therapies. Such a tool is needed to increase the efficacy and effectiveness of treatment. One indicator of OA is proteoglycan depletion. Some studies have shown that cartilage proteoglycan content is indicated by T1ρ relaxation values. These studies theorize that an increase in T1ρ indicates proteoglycan depletion. In MR, T1ρ is the exponential decay constant that describes a decay of transverse magnetization during RF spin lock that causes a spin-lattice relaxation in the rotating frame. The spin-lattice relaxation in the rotating frame probes the slow motion interactions between motionally restricted water molecules and the local macromolecular environment. T1ρ quantification has also been applied to the MR imaging of muscle, breast, liver, brain, spine, and tumors and has shown diagnostic promise in these areas as well.

Conventional quantitative T1ρ imaging is predominantly a single slice method in which only one transverse image of an object is generated. Multislice two-dimensional (2D) and three-dimensional (3D) methods have been suggested that generate multiple transverse images of the internal structure of the object. However both the suggested 2D and 3D methods require retrospective correction of either T2ρ saturation or T1-weighting. Retrospective correction, which necessarily assumes a constant T2ρ or T1 value, can adversely affect quantitative accuracy. Quantitative accuracy is especially adversely affected in imaging of non-homogeneous anatomy such as the brain. Quantitative T2ρ and T1 maps could be acquired but this greatly increases complexity of the experiment.

For the reasons stated above, and for other reasons stated below which will become apparent to those skilled in the art upon reading and understanding the present specification, there is a need in the art for a more effective method of diagnosing osteoarthritis. There is also a need for a multi-slice quantitative T1ρ imaging sequence that does not require any retrospective correction and that improves quantitative accuracy of multi-slice imaging.

BRIEF DESCRIPTION OF THE INVENTION

The above-mentioned shortcomings, disadvantages and problems are addressed herein, which will be understood by reading and studying the following specification.

This invention presents a multi-slice quantitative T1ρ imaging sequence that does not require any retrospective correction. T1ρ values generated from data acquired during a multi-slice quantitative T1ρ imaging sequence can be an early indication of cartilage proteoglycan content, which can be an indication of osteoarthritis (OA). Thus, quantitative T1ρ imaging directly impacts the quality of care and outcome for OA patients by providing early diagnosis and a means to monitor the effectiveness of therapy. Thus, a multi-slice quantitative T1ρ imaging sequence offers an accurate and clinically viable tool for the early detection of OA.

In one aspect, acquisition of "pure" (i.e. uncontaminated) T1ρ-weighted multi-slice images provides the generation of accurate T1ρ values without retrospective correction for T1 or T2ρ contamination. Thus, this aspect solves the need in the art for a more effective method of diagnosing osteoarthritis and solves the need in the art for a multi-slice quantitative T1ρ imaging sequence that does not require any retrospective correction.

In another aspect, an RF chopping approach is implemented in quantitative T1ρ imaging without retrospective correction for T1 or T2ρ contamination.

In yet another aspect, a system increases the clinical efficacy of quantitative T1ρ by enabling multi-slice acquisitions of T1ρ-weighted data that is combined to form a quantitative T1ρ map without retrospective correction for the contaminating effects of other MR relaxation parameters (T2ρ or otherwise).

In still another aspect, two sets of complex images are acquired in order to prevent T1 from contaminating a series of T1ρ maps that are calculated from a set of T2ρ-weighted images that are acquired at different locations. One set of K-space is acquired with an inversion pulse placed between magnetization preparation and image acquisition and one set of images is acquired without an inversion pulse. These two sets of complex images are combined to get an image which is described by $2M_z^{prep} e^{-t_a/T1}$ wherein $t_a$ represents a time between an end of magnetization preparation and image acquisition, wherein $M_z^{prep}$ represents a Z magnetization immediately after magnetization preparation, and wherein $e^{-t_a/T1}$ represents a constant for fixed $t_a$. $t_a$ is the same value for all images acquired at the same the same location, regardless of $M_z^{prep}$. Also, in one embodiment, the two "images" are combined in K-space prior to Fourier transform and magnitude calculations.

In a further aspect, the two sets of images can be mathematically described as follows: The set of images acquired with an inversion pulse as $M_0(1-e^{-t_a/T1})-M_z^{prep}e^{-t_a/T1}$ and the set of complex images without an inversion pulse as $M_0(1-e^{-t_a/T1})+M_z^{prep}e^{-t_a/T1}$, wherein $M_z^{prep}$ represents a Z magnetization immediately after magnetization preparation, wherein $M_0$ represents a fully recovered Z magnetization.

Subtracting the former from the later generates a sequence of images at different locations which can then be mathematically combined to form a set of quantitative T1ρ maps that are uncontaminated by T1.

Systems, clients, servers, methods, and computer-readable media of varying scope are described herein. In addition to the aspects and advantages described in this summary, further aspects and advantages will become apparent by reference to the drawings and by reading the detailed description that follows.

DETAILED DESCRIPTION OF THE INVENTION

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The detailed description is divided into five sections. In the first section, a system level overview is described. In the second section, embodiments of methods are described. In the third section, the hardware and the operating environment in conjunction with which embodiments may be practiced are described. In the fourth section, particular implementations are described. Finally, in the fifth section, a conclusion of the detailed description is provided.

System Level Overview

Figure 1:
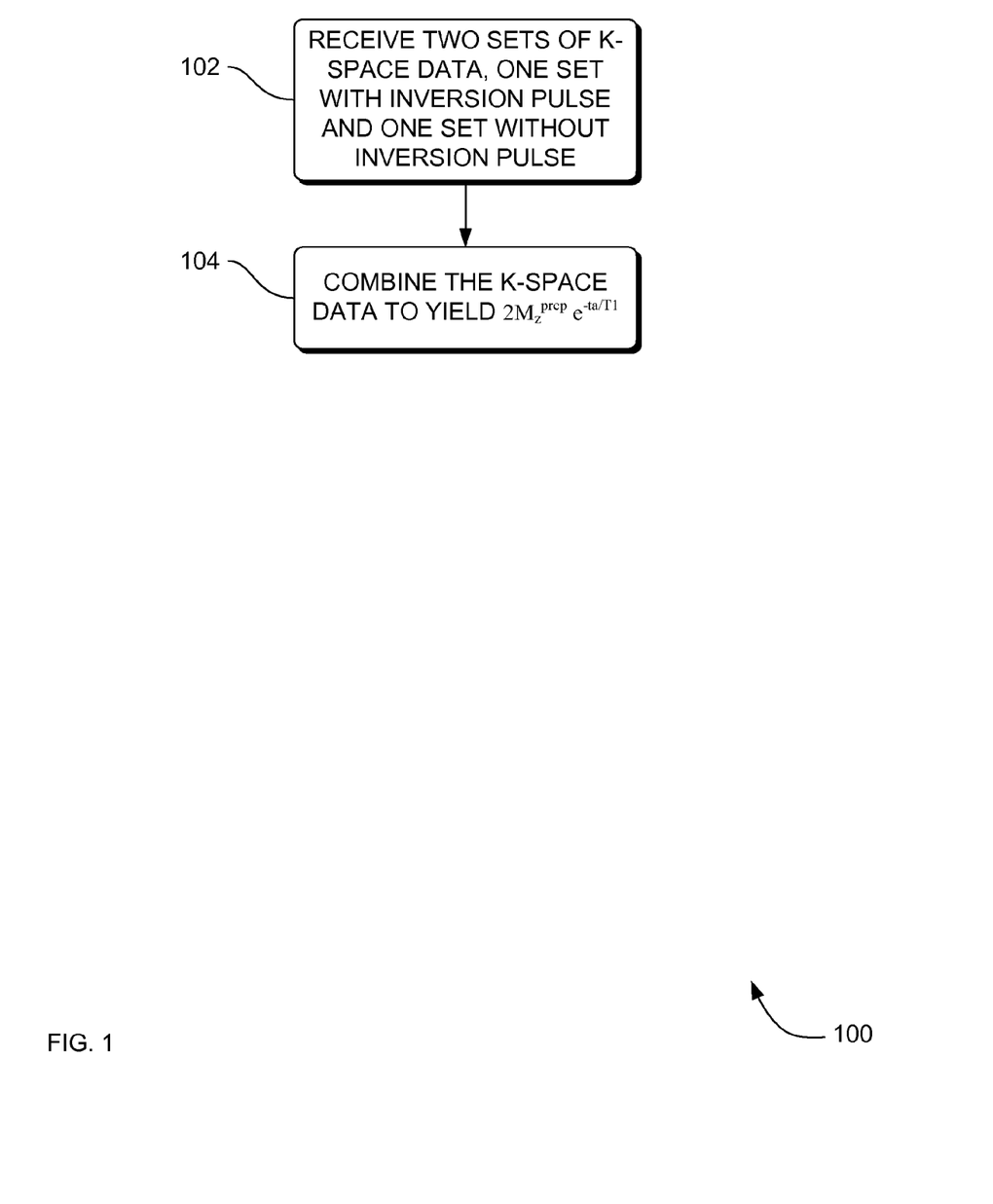
FIG. 1 is a diagram illustrating a system-level overview of an embodiment.

FIG. 1 is a block diagram that provides an overview of a method to generate a sequence of two-dimensional magnetic resonance images. Method 100 solves the need in the art for a multi-slice quantitative T1ρ imaging sequence that does not require any retrospective correction for contaminating effects of other MR relaxation parameters.

Method 100 includes receiving and/or acquiring 102 and receiving two sets of magnetic resonance image data. One set of magnetic resonance image data that was acquired with inversion pulse immediately after magnetization preparation (for the imparting of desired contrast weighting) and immediately before image acquisition and the other set of magnetic resonance image data that was acquired without inversion pulse. One embodiment of receiving and/or acquiring (102) two sets of magnetic resonance image data is acquiring (202) K-space data with an inversion pulse and acquiring (204) K-space data with no inversion pulse in FIG. 2 below. One embodiment of receiving and/or acquiring (102) two sets of magnetic resonance image data is method 300 below.

Method 100 also includes combining 104 the two sets of image data to derive, obtain or yield $2M_z^{prep} e^{-ta/T1}$. $2M_z^{prep} e^{-ta/T1}$ has a multiplicative T1 term, $e^{-ta/T1}$, that does not vary with $M_z^{prep}$ and is a constant for a fixed timing between magnetization preparation and image acquisition. In the combining action 104, $M_z^{prep}$ represents a Z magnetization immediately after magnetization preparation, $t_a$ represents a time between an end of magnetization preparation and image acquisition, and $e^{-ta/T1}$ represents a constant for a fixed $t_a$ such that $e^{-ta/T1}$ is not a contaminating term when the acquired data is combined to generate quantitative T1ρ values. One embodiment of the action of combining (104) is the action of generating (206) a signal in FIG. 2 below.

In method 100, $M_z^{prep}$ is proportional to $e^{-TSL/T1\rho}$, where TSL (time spin lock) represents spin lock duration. In method 100, images are provided with different T1ρ weighting by varying TSL from acquisition to acquisition. In method 100, the resulting images that are acquired with different TSL are combined to generate T1ρ maps or T1ρ values for specified regions of interest. In one view, method 100 is the application or implementation of RF chopping to quantitative T1ρ imaging. In some embodiments, the two "images" are combined in k-space prior to fourier transform and magnitude calculations. Further details of another embodiment for obtaining the signal of $2M_z^{prep} e^{-ta/T1}$ is described below in method 200 in FIG. 2 below.

The overview of the operation of an embodiment is described in this section of the detailed description. A method to generate a sequence of two-dimensional magnetic resonance images for a 2D multi-slice acquisition that does not require any retrospective correction to obtain quantitatively accurate T1ρ values. Some embodiments operate in a multi-processing, multi-threaded operating environment on a computer, such as computer 502 in FIG. 5.

While the method 100 is not limited to any particular two-dimensional magnetic resonance imaging acquisition scheme, magnetization preparation methodology, pulse sequence timing, or number of different TSL acquired, but for sake of clarity some assumptions may be made for the embodiments discussed herein.

METHOD EMBODIMENTS

In the previous section, an overview of the operation of embodiments are described. In this section, the particular methods of such an embodiment are described by reference to a series of flowcharts. Describing the methods by reference to a flowchart enables one skilled in the art to develop such programs, firmware, or hardware, including such instructions to carry out the methods on suitable computers, executing the instructions from computer-readable media. Similarly, the methods performed by the server computer programs, firmware, or hardware are also composed of computer-executable instructions. Methods 100-400 are performed by a program executing on, or performed by firmware or hardware that is a part of, a computer, such as computer 502 in FIG. 5.

Figure 2:
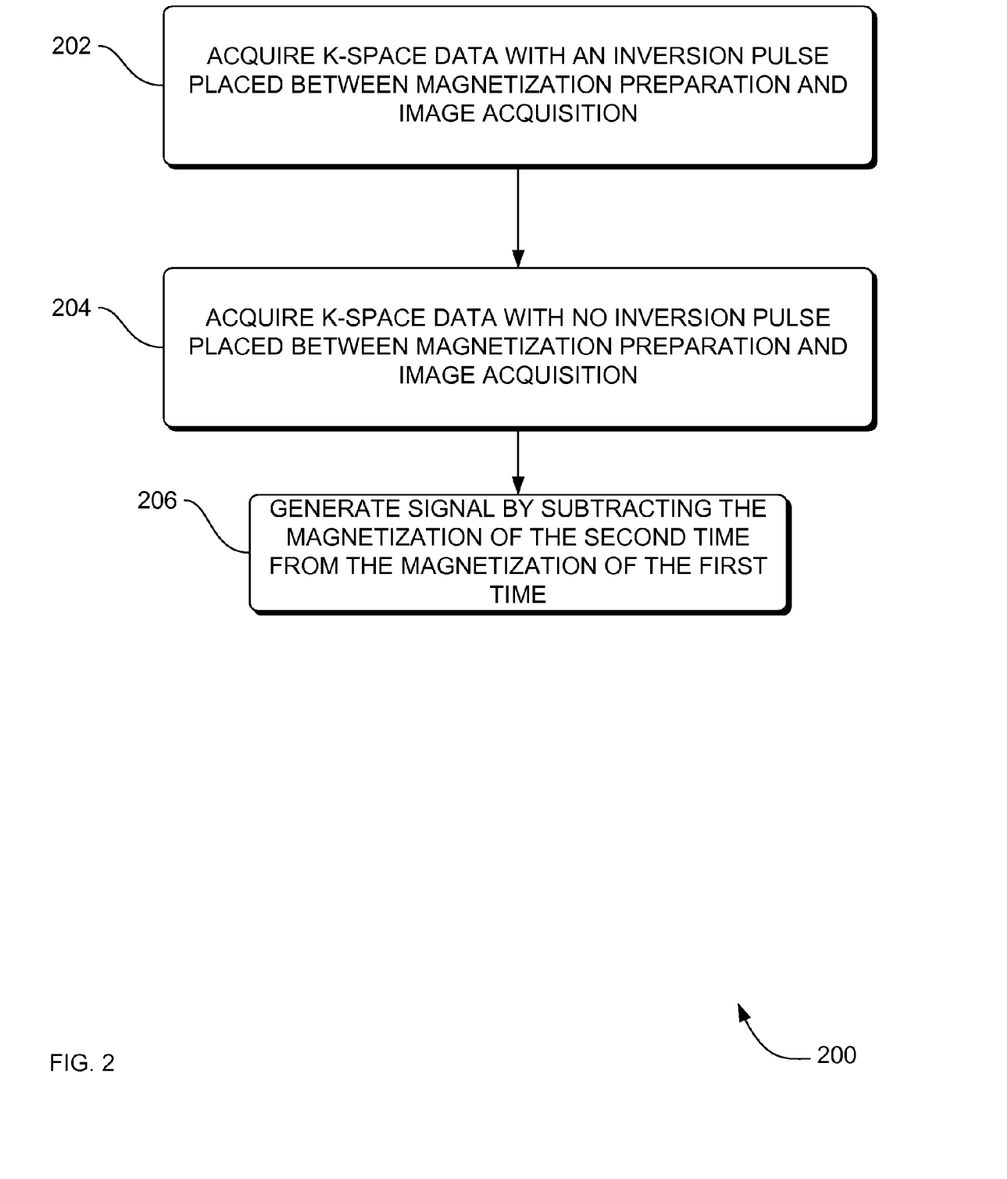
FIG. 2 is a flowchart of a method to generate a sequence of two-dimensional magnetic resonance images, according to an embodiment.

FIG. 2 is a flowchart of a method 200 to generate a sequence of two-dimensional magnetic resonance images, according to an embodiment. Method 200 solves the need in the art for a multi-slice quantitative T1ρ imaging sequence that does not require any retrospective correction for the contaminating effects of other MR relaxation parameters, and therefore, improves the accuracy of quantitative multi-slice imaging.

Method 200 includes acquiring 202 K-space data with an inversion pulse placed between magnetization preparation and image acquisition. The acquiring 202 includes acquiring $M_z(t_a)(1)$ as $M_0(1-e^{-ta/T1})-M_z^{prep}e^{-ta/T1}$. In method 200, $M_z$ represents a magnetization, $t_a$ represents the time between the end of magnetization preparation and image acquisition, $M_z^{prep}$ represents a Z magnetization immediately after magnetization preparation, $M_0$ represents a fully recovered Z magnetization, and $e^{-ta/T1}$ represents a constant T1 contribution for fixed $t_a$.

Method 200 also includes acquiring 204 K-space data with no inversion pulse placed between magnetization preparation and image acquisition. The acquiring 204 includes acquiring $M_z(t_a)(2)$ as $M_0(1-e^{-ta/T1})+M_z^{prep}e^{-ta/T1}$.

Figure 3:
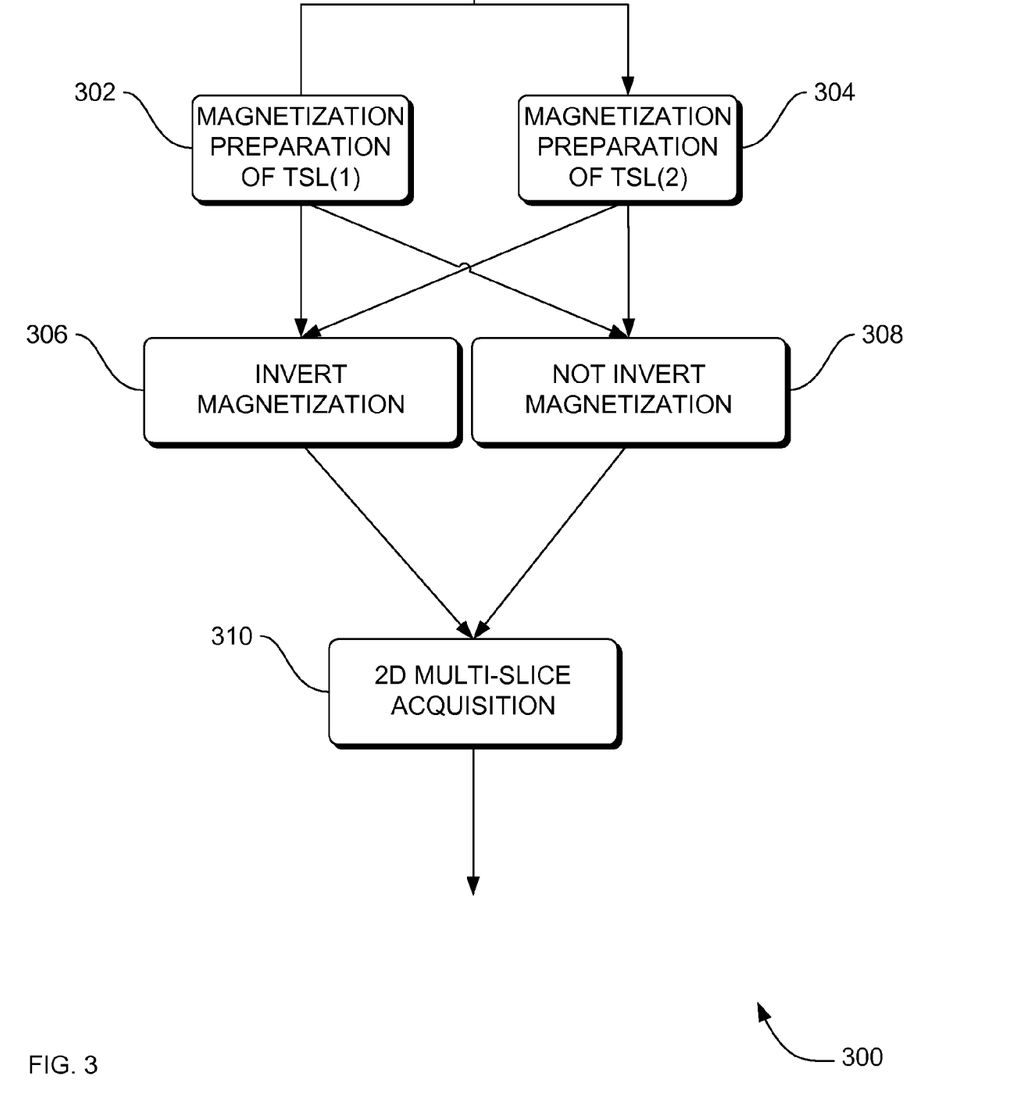
FIG. 3 is a flowchart of a method of acquiring images, according to an embodiment.

The acquiring (202) K-space data with an inversion pulse and the acquiring (204) K-space data with no inversion pulse are one embodiment of receiving and/or acquiring (102) and receiving two sets of magnetic resonance image data in FIG. 1 above. Method 300 below is one embodiment of the acquiring (202) K-space data with an inversion pulse and the acquiring (204) K-space data with no inversion pulse.

Subsequently method 200 also includes generating 206 a signal that has a fixed multiplicative T1 factor for a fixed $t_a$ by subtracting $M_z(t_a)(1)$ from $M_z(t_a)(2)$. Generating (206) a signal is one embodiment of combining (104 in FIG. 1 above) the two sets of image data to derive $2M_z^{prep} e^{-ta/T1}$. Method 200 solves the need for a multi-slice quantitative T1ρ imaging sequence that does not require any retrospective correction and, in fact, improves the quantitative accuracy of multi-slice quantitative imaging.

Actions 202, 204 and 206 are one manner of generating a sequence of two-dimensional magnetic resonance images in FIG. 1. Actions 202 and 204 can be performed simultaneously, interleaved or in any order relative to each other. Actions 202 and 204 are not necessarily performed in the order shown in FIG. 2.

FIG. 3 is a flowchart of a method 300 of acquiring images, according to an embodiment. Method 300 is one embodiment of receiving and/or acquiring (102) two sets of magnetic resonance image data in FIG. 1 above. Method 300 is one embodiment of the acquiring (202) K-space data with an inversion pulse and the acquiring (204) K-space data with no inversion pulse in FIG. 2 above.

In method 300, magnetization preparation of two time spin-locks are performed, a preparation 302 for spin lock duration(1) and a preparation 304 for spin lock duration(2).

Thereafter, magnetization is inverted 306 for both spin lock durations and magnetization is not is inverted 308 for both spin lock durations. The actions of preparation (302) for TSL(1), the preparation (304) for TSL(2), the inverted magnetization (306) and the magnetization (308) in aggregate is one embodiment of the acquiring (102) in FIG. 1 of two sets of magnetic resonance image data, in which one set of magnetic resonance image data is acquired with inversion pulse and the other set of magnetic resonance image data is acquired without inversion pulse.

Thereafter, a multislice 2D image acquisition 310 is performed from the inverted magnetization 306 and the not inverted magnetization 308. Some embodiments of image acquisition (310) includes combining (104) the two sets of image data to derive, obtain or yield $2M_z^{prep} e^{-ta/T1}$. $2M_z^{prep} e^{-ta/T1}$ is uncontaminated by T1-weighted contrast. In the combining action (104), $M_z^{prep}$ represents a Z magnetization immediately after magnetization preparation, $t_a$ represents a time between an end of magnetization preparation and image acquisition, and $e^{-ta/T1}$ represents a constant for a fixed $t_a$ in which $e^{-ta/T1}$ is not a contaminating term.

Figure 4:
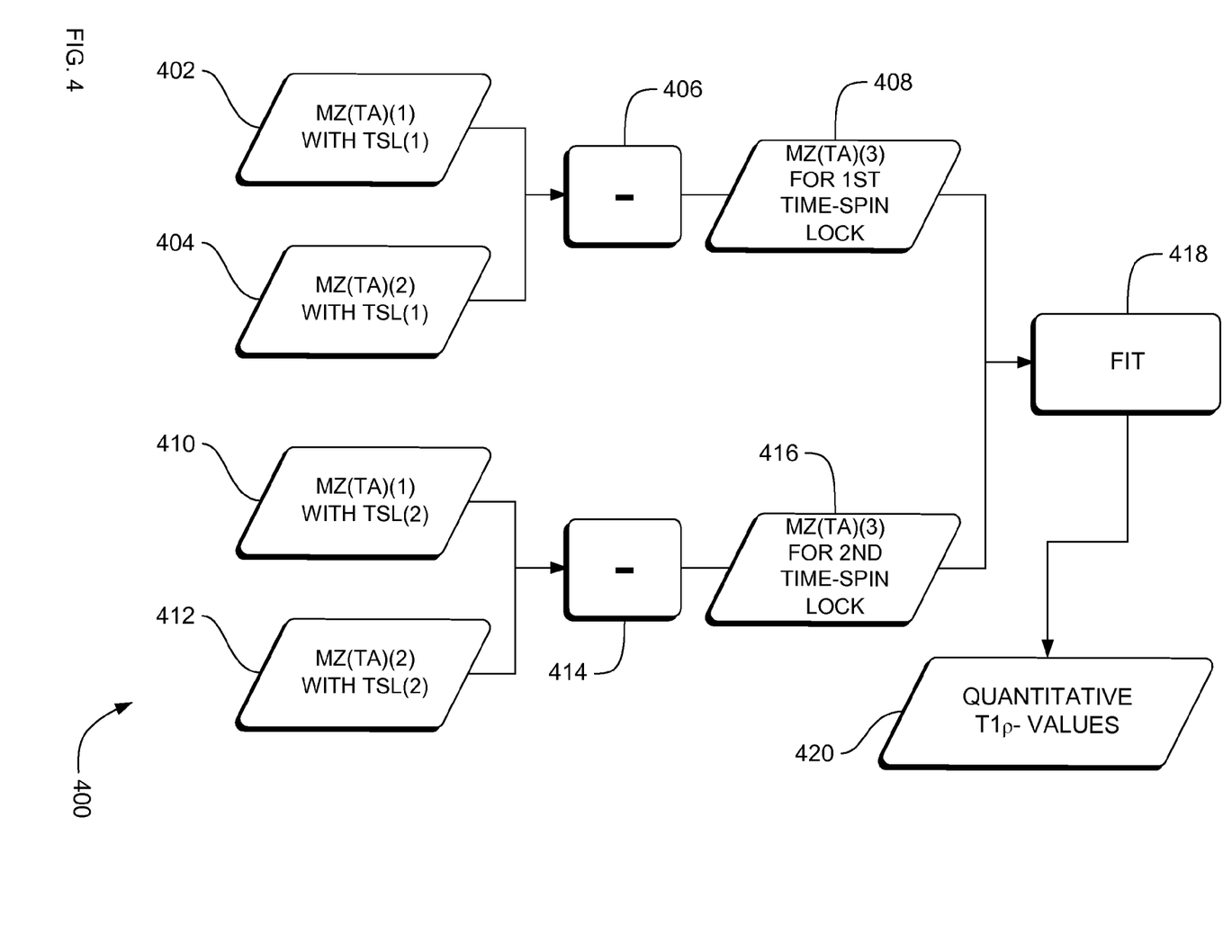

FIG. 4 is a flowchart of a method 400 of acquiring images, according to an embodiment. Method 400 includes receiving 402 a plurality of complex images for a first time spin lock (TSL) having inverted magnetization in the Fourier domain $M_z(t_a)(1)$ that equals $M_0(1-e^{-ta/T1})-M_z^{prep}(TSL1)e^{-ta/T1}$ of the plurality of two-dimensional images.

Method 400 also includes receiving 404 a plurality of complex images for a first TSL without inverted magnetization in the Fourier domain $M_z(t_a)(2)$ that equals $M_0(1-e^{-ta/T1})+M_z^{prep}(TSL1)e^{-ta/T1})$ of the plurality of two-dimensional images.

In action 406 the acquisition following inversion in action 402 is subtracted from acquisition without inversion to yield a signal 408 that has a multiplicative T1 component with is independent of TSL and is constant for a fixed timing between magnetization preparation and image acquisition.

Method 400 includes receiving 410 a plurality of complex images for a second TSL having inverted magnetization in the Fourier domain $M_z(t_a)(1)$ that equals $M^0(1-e^{-ta/T1})-M_z^{prep}(TSL2)e^{-ta/T1}$ of the plurality of two-dimensional images.

Method 400 also includes receiving 412 a plurality of complex images for a second TSL without inverted magnetization in the Fourier domain $M_z(t_a)(2)$ that equals $M_0(1-e^{-ta/T1})+M_z^{prep}(TSL2)e^{-ta/T1}$ of the plurality of two-dimensional images.

In action 414 the acquisition following inversion in action 410 is subtracted from acquisition without inversion to yield a signal 416 that has a multiplicative T1 component that is independent of TSL and is constant for a fixed timing between magnetization preparation and image acquisition. Data and actions 402-416 are one embodiment of receiving and/or acquiring (102) two sets of magnetic resonance image data. Data and actions 402-416 are one embodiment of acquiring (202) K-space data with an inversion pulse and the acquiring (204) K-space data with no inversion pulse in FIG. 2 below.

Thereafter, a fit is calculated 418 from the T1ρ weighted images 408 and 416 for which yields quantitative T1ρ maps or values 420 without retrospective correction for T1 or T2ρ contamination. In some embodiments, method 400 is performed after method 300.

Figure 5:
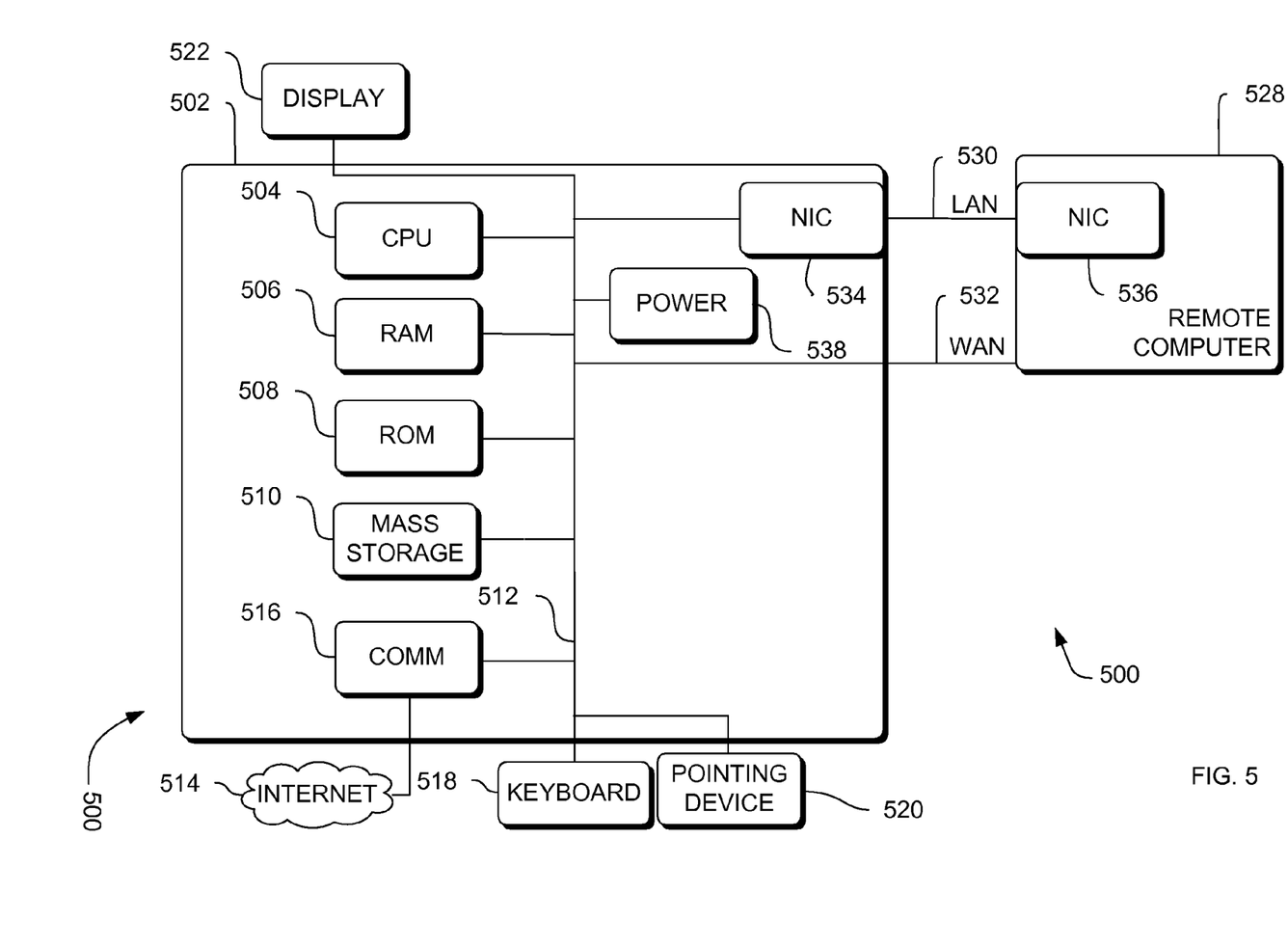
FIG. 5 is a block diagram of the hardware and operating environment in which different embodiments can be practiced.

In some embodiments, methods 100-400 are implemented as a computer data signal embodied in a carrier wave, that represents a sequence of instructions which, when executed by a processor, such as processor 504 in FIG. 5 or array processors in MR system electronics, cause the processor to perform the respective method. In other embodiments, methods 100-400 are implemented as a computer-accessible medium having executable instructions capable of directing a processor, such as processor 504 in FIG. 5 or array processors in MR system electronics, to perform the respective method. In varying embodiments, the medium is a magnetic medium, an electronic medium, or an optical medium.

Hardware and Operating Environment

FIG. 5 is a block diagram of the hardware and operating environment 500 in which different embodiments can be practiced. The description of FIG. 5 provides an overview of computer hardware and a suitable computing environment in conjunction with which some embodiments can be implemented. Embodiments are described in terms of a computer executing computer-executable instructions. However, some embodiments can be implemented entirely in computer hardware in which the computer-executable instructions are implemented in read-only memory. Some embodiments can also be implemented in client/server computing environments where remote devices that perform tasks are linked through a communications network. Program modules can be located in both local and remote memory storage devices in a distributed computing environment.

Computer 502 includes a processor 504, commercially available from Intel, Motorola, Cyrix and others. Computer 502 also includes random-access memory (RAM) 506, read-only memory (ROM) 508, and one or more mass storage devices 510, and a system bus 512, that operatively couples various system components to the processing unit 504. The memory 506, 508, and mass storage devices, 510, are types of computer-accessible media. Mass storage devices 510 are more specifically types of nonvolatile computer-accessible media and can include one or more hard disk drives, floppy disk drives, optical disk drives, and tape cartridge drives. The processor 504 executes computer programs stored on the computer-accessible media.

Computer 502 can be communicatively connected to the Internet 514 via a communication device 516. Internet 514 connectivity is well known within the art. In one embodiment, a communication device 516 is a modem that responds to communication drivers to connect to the Internet via what is known in the art as a "dial-up connection." In another embodiment, a communication device 516 is an Ethernet® or similar hardware network card connected to a local-area network (LAN) that itself is connected to the Internet via what is known in the art as a "direct connection" (e.g., T1 line, etc.).

A user enters commands and information into the computer 502 through input devices such as a keyboard 518 or a pointing device 520. The keyboard 518 permits entry of textual information into computer 502, as known within the art, and embodiments are not limited to any particular type of keyboard. Pointing device 520 permits the control of the screen pointer provided by a graphical user interface (GUI) of operating systems such as versions of Microsoft Windows®. Embodiments are not limited to any particular pointing device 520. Such pointing devices include mice, touch pads, trackballs, remote controls and point sticks. Other input devices (not shown) can include a microphone, joystick, game pad, satellite dish, scanner, or the like.

In some embodiments, computer 502 is operatively coupled to a display device 522. Display device 522 is connected to the system bus 512. Display device 522 permits the display of information, including computer, video and other information, for viewing by a user of the computer. Embodiments are not limited to any particular display device 522. Such display devices include cathode ray tube (CRT) displays (monitors), as well as flat panel displays such as liquid crystal displays (LCD's). In addition to a monitor, computers typically include other peripheral input/output devices such as printers (not shown).

Computer 502 also includes an operating system (not shown) that is stored on the computer-accessible media RAM 506, ROM 508, and mass storage device 510, and is and executed by the processor 504. Examples of operating systems include Microsoft Windows®, Apple MacOS®, Linux®, UNIX®. Examples are not limited to any particular operating system, however, and the construction and use of such operating systems are well known within the art.

Embodiments of computer 502 are not limited to any type of computer 502. In varying embodiments, computer 502 comprises a PC-compatible computer, a MacOS®-compatible computer, a Linux®-compatible computer, or a UNIX®-compatible computer. The construction and operation of such computers are well known within the art.

Computer 502 can be operated using at least one operating system to provide a graphical user interface (GUI) including a user-controllable pointer. Computer 502 can have at least one web browser application program executing within at least one operating system, to permit users of computer 502 to access an intranet, extranet or Internet world-wide-web pages as addressed by Universal Resource Locator (URL) addresses. Examples of browser application programs include Netscape Navigator® and Microsoft Internet Explorer®.

The computer 502 can operate in a networked environment using logical connections to one or more remote computers, such as remote computer 528. These logical connections are achieved by a communication device coupled to, or a part of, the computer 502. Embodiments are not limited to a particular type of communications device. The remote computer 528 can be another computer, a server, a router, a network PC, a client, a peer device or other common network node. The logical connections depicted in FIG. 5 include a local-area network (LAN) 530 and a wide-area network (WAN) 532. Such networking environments are commonplace in offices, enterprise-wide computer networks, intranets, extranets and the Internet.

When used in a LAN-networking environment, the computer 502 and remote computer 528 are connected to the local network 530 through network interfaces or adapters 534, which is one type of communications device 516. Remote computer 528 also includes a network device 536. When used in a conventional WAN-networking environment, the computer 502 and remote computer 528 communicate with a WAN 532 through modems (not shown). The modem, which can be internal or external, is connected to the system bus 512. In a networked environment, program modules depicted relative to the computer 502, or portions thereof, can be stored in the remote computer 528.

Computer 502 also includes power supply 538. Each power supply can be a battery.

Apparatus Implementation

Referring to FIGS. 6-10, particular implementations are described.

Figure 6:
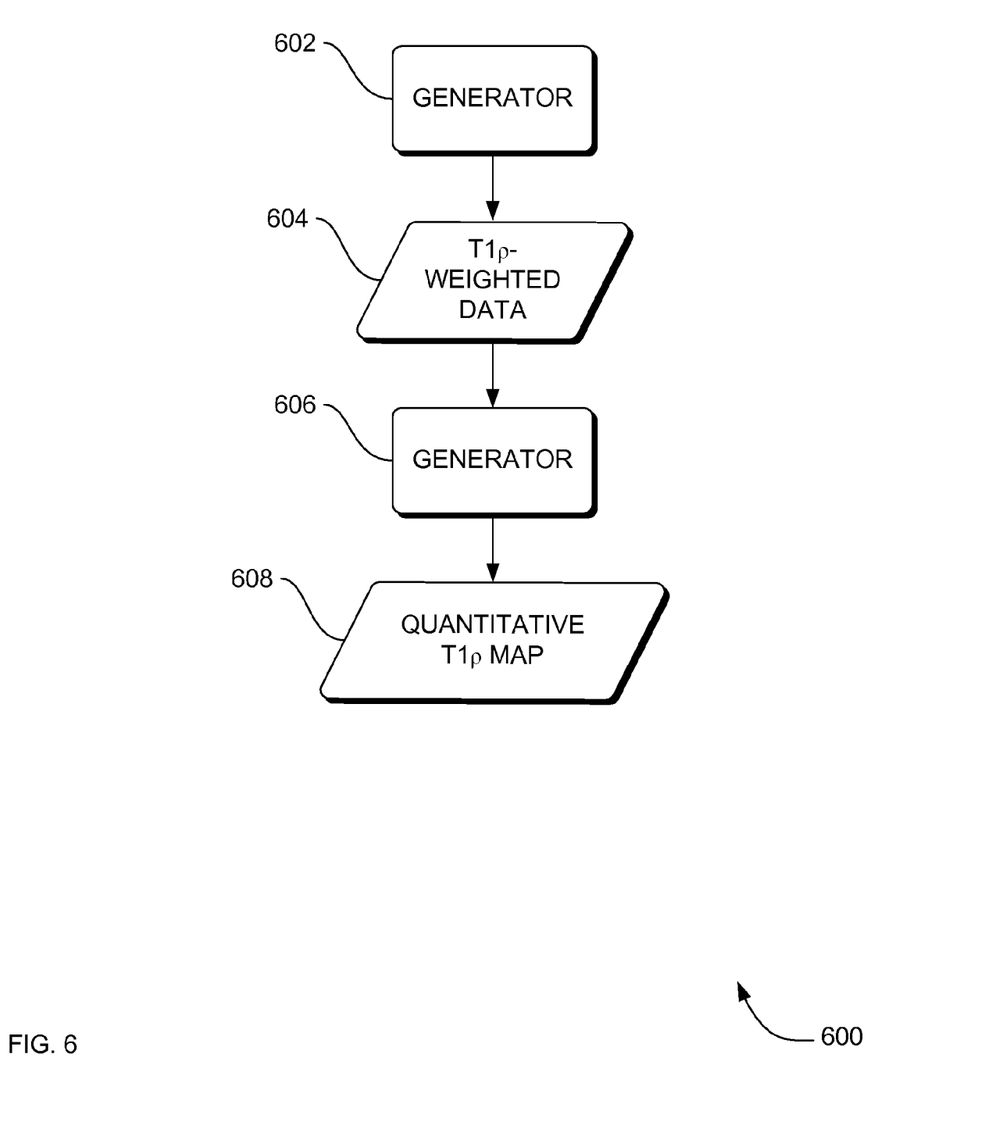
FIG. 6 is a block diagram of an apparatus to increase the clinical efficacy of quantitative T1ρ in imaging medical, according to an embodiment.

FIG. 6 is a block diagram of an apparatus 600 to increase the clinical efficacy of quantitative T1ρ in imaging medical. Apparatus 600 includes a generator 602 of T1ρ-weighted data 604. Apparatus 600 also includes a generator 606 of a quantitative T1ρ map 608 from the multi-slice acquisitions of T1ρ-weighted data 604.

In some embodiments, the generator 606 of the quantitative T1ρ map includes a generator of the quantitative T1ρ map that combines the multi-slice acquisitions of T1ρ-weighted data.

Apparatus 600 components such as the generator 602 of multi-slice acquisitions and the generator 606 of a quantitative T1ρ map can be embodied as computer hardware circuitry or as a computer-readable program, or a combination of both.

More specifically, in the computer-readable program embodiment, the programs can be structured in an object-orientation using an object-oriented language such as Java, Smalltalk or C++, and the programs can be structured in a procedural-orientation using a procedural language such as COBOL or C. The software components communicate in any of a number of means that are well-known to those skilled in the art, such as application program interfaces (API) or inter-process communication techniques such as remote procedure call (RPC), common object request broker architecture (CORBA), Component Object Model (COM), Distributed Component Object Model (DCOM), Distributed System Object Model (DSOM) and Remote Method Invocation (RMI). The components execute on as few as one computer as in computer 502 in FIG. 5, or on at least as many computers as there are components.

Figure 7:
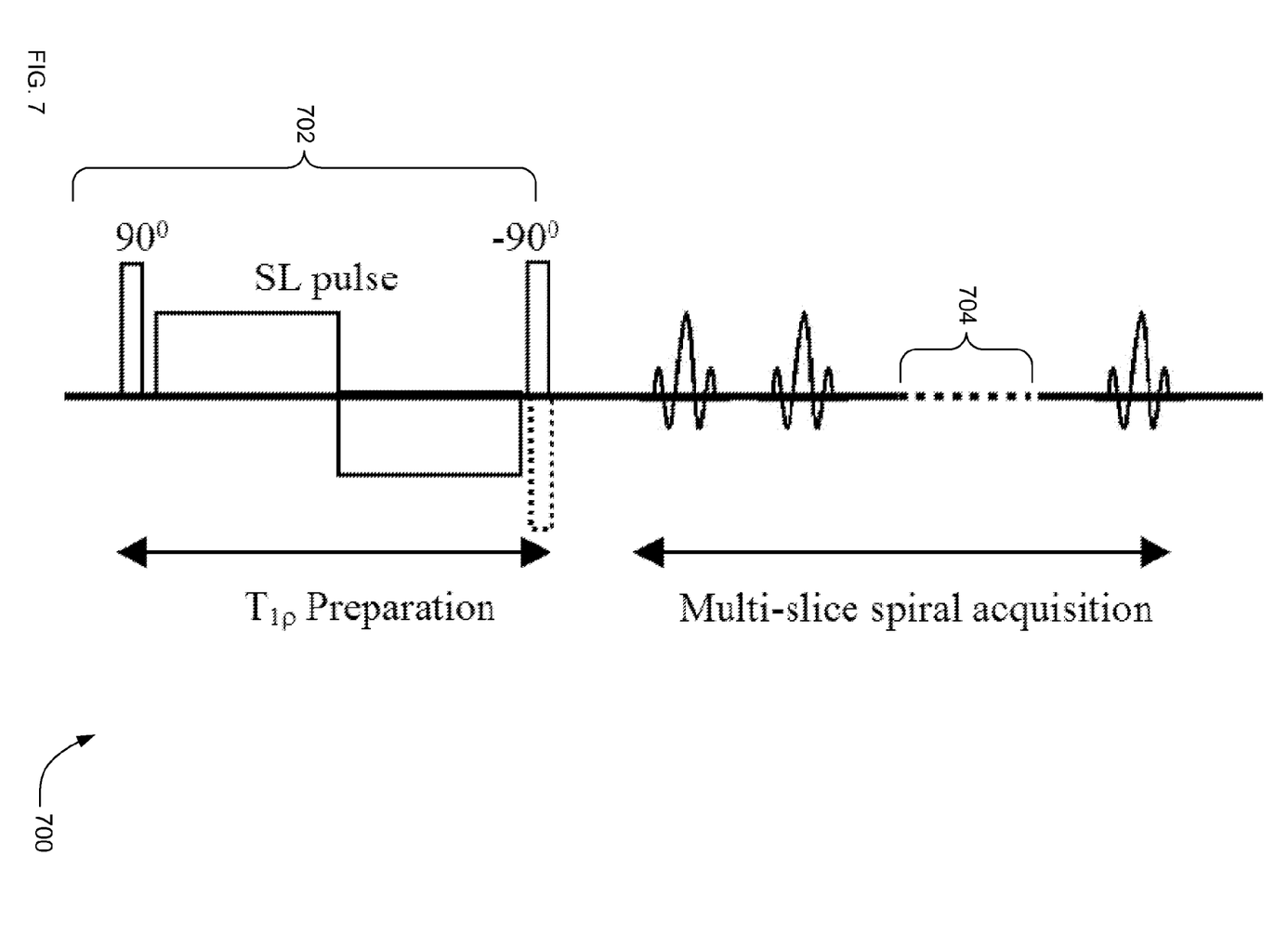
FIG. 7 is an MR pulse sequence diagram of a process to generate a set of two-dimensional magnetic resonance images, according to an embodiment.

FIG. 7 is a MR pulse sequence diagram 700 of a process to generate of two-dimensional magnetic resonance images, according to an embodiment. Diagram 700 shows a multi-slice quantitative T1ρ pulse sequence.

In diagram 700, magnetization is inverted in alternate acquisitions 702 by alternating the phase of the T1ρ prep's second hard 90, as shown by the dotted pulse 704. A spiral readout is used for image acquisition. Some embodiments have a separate 180 degree pulse that plays out after the tipup 90, where the phase of the 90 doesn't change.

Figure 8:
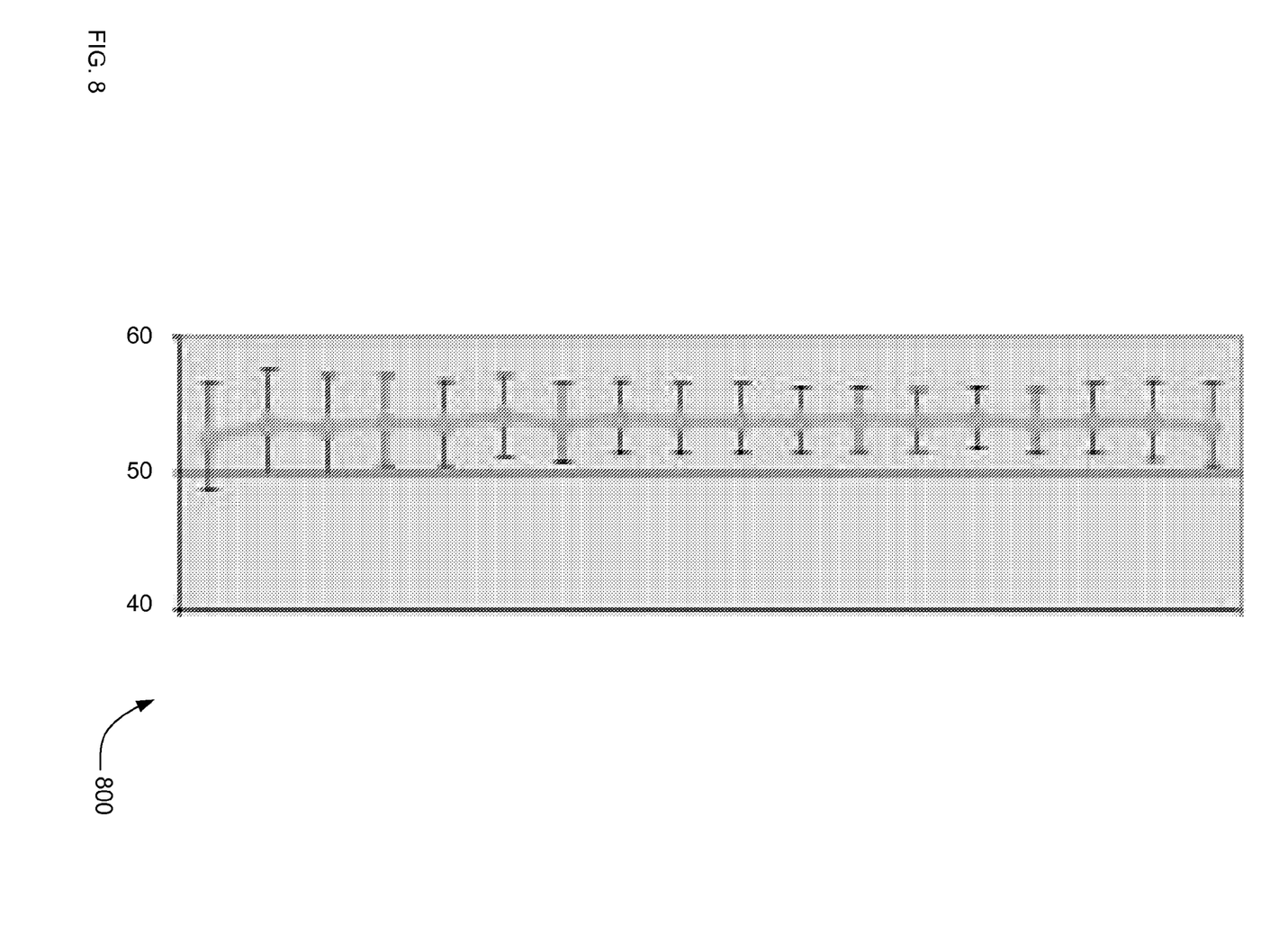
FIG. 8 is a graph of T1ρ values of a homogeneous phantom at different slice locations as acquired, according an embodiment.

FIG. 8 is a graph of T1ρ values of a homogeneous phantom at different slice locations as acquired, according to an embodiment. In FIG. 8, a multi-slice quantitative T1ρ pulse sequence, as described above, is implemented and tested at 3.0 Tesla. A phantom is constructed to verify the accuracy of the T1ρ measurement and to demonstrate maintenance of the T1ρ value over all acquired slices. In FIG. 8, agarose phantom T1ρ values corresponding to 18 slices acquired using methods of FIGS. 1-4. T1ρ variation across that slices is within 3.7%. The T1ρ values remain fairly constant, regardless of slice. If T1 contamination remained, T1ρ values would not remain constant across all slices.

Figure 9:
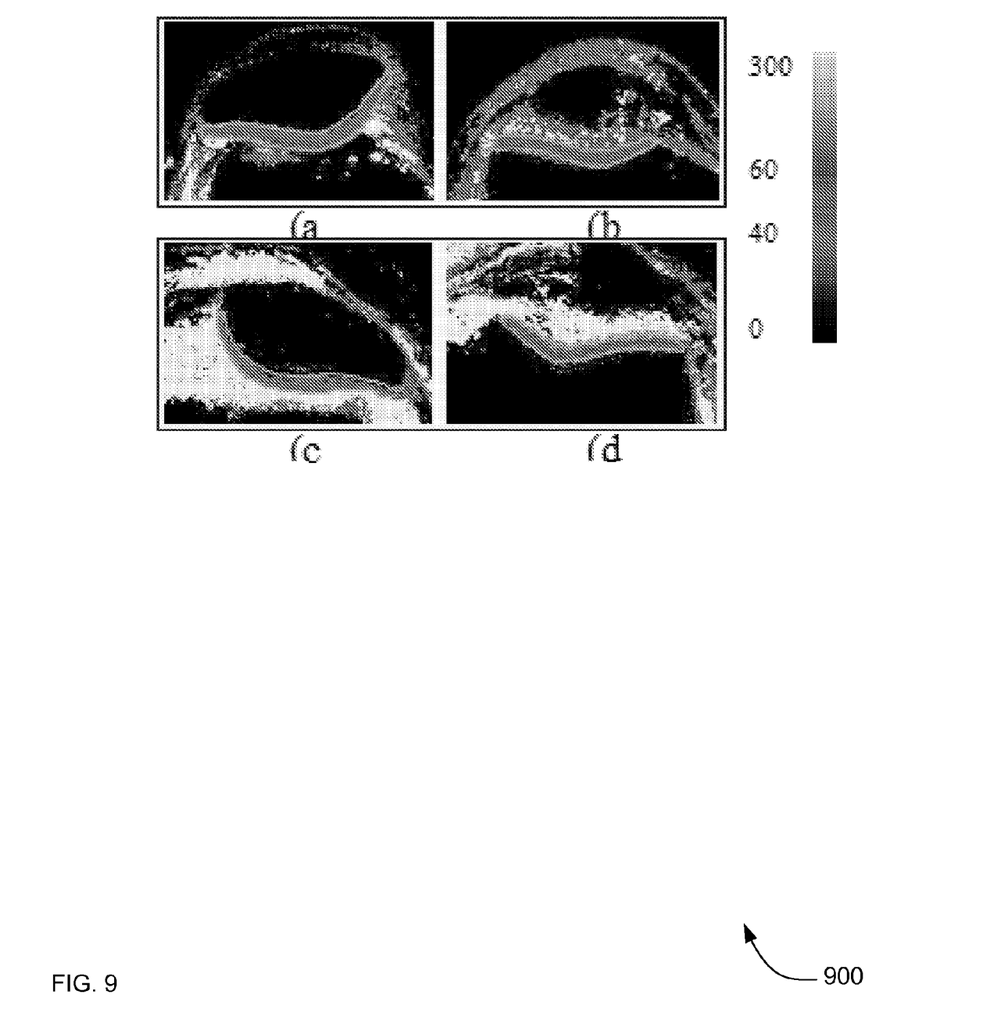
FIG. 9 is a diagram of images of T1ρ maps of cartilage of healthy volunteers and osteoarthritis patients, according to an embodiment.

FIG. 9 is a diagram of images 900 of T1ρ maps of cartilage of healthy volunteers and osteoarthritis patients, according to an embodiment. The images 900 were acquired at a field strength of 3.0 Tesla. Images 900 show T1ρ maps of a healthy volunteer (a, b) and an osteoarthritis patient (c, d). Note elevated T1ρ values in femoral cartilage of patient (d).

Figure 10:
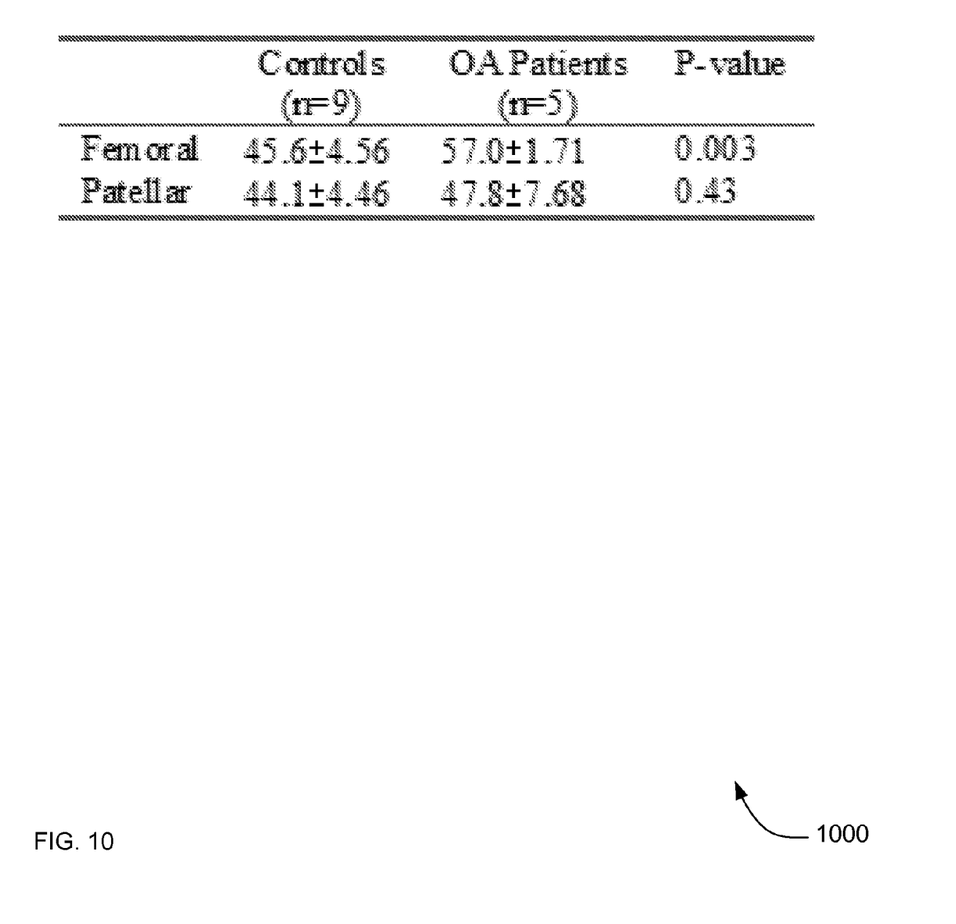
FIG. 10 is a table of in vivo cartilage T1ρ values, according to an embodiment.

FIG. 10 is a table 1000 of in vivo cartilage T1ρ values, according to an embodiment. Table 1000 shows in vivo cartilage T1ρ values within the range of published numbers. In particular, T1ρ is measured in femoral and patella cartilage. Note elevated femoral T1ρ in osteoarthritis patients.

CONCLUSION

A technical effect of the disclosed systems, methods and apparatus is an increase in the clinical efficacy of quantitative T1ρ by enabling multi-slice acquisitions of T1ρ-weighted data that is combined to form a quantitative T1ρ map without retrospective correction for the contaminating effects of other MR relaxation parameters (T2ρ or otherwise). Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations. For example, although described in procedural terms, one of ordinary skill in the art will appreciate that implementations can be made in an object-oriented design environment or any other design environment that provides the required relationships.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future communication devices, different file systems, and new data types.

The terminology used in this application is meant to include all imaging, object-oriented, database and communication environments and alternate technologies which provide the same functionality as described herein.

I claim:

1. A computer-accessible medium having executable instructions to generate a sequence of medical two-dimensional images, the executable instructions capable of directing a processor to perform:
   receiving the sequence of the two-dimensional magnetic resonance images, wherein a subset of the images is inverted for spin lock durations and the remainder of the images are not inverted for spin lock durations; and
   generating a signal that has a fixed multiplicative T1 factor for a fixed $t_a$ and being uncontaminated by T2ρ saturation by generating T1ρ maps from the two-dimensional magnetic resonance images that can be described by $M_z(t_a)$ as $2M_z^{prep} e^{-t_a/T1}$,
   wherein $t_a$ represents a time between an end of magnetization preparation and image acquisition,
   wherein $M_z^{prep}$ represents a Z magnetization immediately after magnetization preparation, and
   wherein $e^{-t_a/T1}$ represents a constant for fixed $t_a$,
   wherein the computer-accessible medium improves quantitative accuracy of multi-slice imaging.

2. The computer-accessible medium of claim 1, wherein the executable instructions capable of directing a processor to perform generating a signal further comprise executable instructions capable of directing a processor to perform:
   receiving $M_z(t_a)(1)$ of the sequence of two-dimensional magnetic resonance images from $M_0(1-e^{-t_a/T1})-M_z^{prep}e^{-t_a/T1}$;
   receiving $M_z(t_a)(2)$ of the sequence of two-dimensional magnetic resonance images from $M_0(1-e^{-t_a/T1})+M_z^{prep}e^{-t_a/T1}$; and
   generating a signal by subtracting $M_z(t_a)(1)$ of the sequence of two-dimensional magnetic resonance images from $M_z(t_a)(2)$,
   wherein $M_0$ represents a fully recovered Z magnetization.

3. The computer-accessible medium of claim 2, wherein acquiring $M_z(t_a)(1)$ is performed interleaved with acquiring $M_z(t_a)(2)$.

4. The computer-accessible medium of claim 2, wherein $M_z(t_a)(1)$ and $M_z(t_a)(2)$ are combined in k-space prior to Fourier transformation of $M_z(t_a)(1)$ and $M_z(t_a)(2)$ and magnitude calculations on $M_z(t_a)(1)$ and $M_z(t_a)(2)$.

5. The computer-accessible medium of claim 2, wherein the executable instructions further comprise executable instructions capable of directing a processor to perform:
   calculating a fit from the T1ρ maps, yielding quantitative T1ρ maps without retrospective correction for T1 or T2ρ contamination.

6. The computer-accessible medium of claim 2, wherein the sequence of two-dimensional magnetic resonance images further comprises:
a sequence of two-dimensional magnetic resonance images of at least a portion of a human breast.

7. The computer-accessible medium of claim 2, wherein the sequence of two-dimensional magnetic resonance images further comprises:
a sequence of two-dimensional magnetic resonance images of at least a portion of a human spine.

8. The computer-accessible medium of claim 2, wherein the sequence of two-dimensional magnetic resonance images further comprises:
a sequence of two-dimensional magnetic image resonance anatomical images.

9. The computer-accessible medium of claim 2, wherein the sequence of two-dimensional magnetic resonance images further comprises:
a sequence of two-dimensional magnetic resonance images of at least a portion of a human brain.

10. The computer-accessible medium of claim 2, wherein the sequence of two-dimensional magnetic resonance images further comprises:
a sequence of two-dimensional magnetic resonance images of at least a portion of human cartilage.

11. A system to increase the clinical medical efficacy of quantitative T1ρ, the system comprising:
a generator of multi-slice acquisitions of T1ρ-weighted data that is operable to:
receive a plurality of complex images for a plurality of time spin locks (TSL) having inverted magnetization in the Fourier domain Mz(ta)(1) that equals M0(1−e$^-$ta/T1)−Mzprep(TSL)e$^-$ta/T1 of the plurality of two-dimensional images,
receive a plurality of complex images for the plurality of TSLs without inverted magnetization in the Fourier domain Mz(ta)(2) that equals M0(1−e$^-$ta/T1)+Mzprep(TSL1)e$^-$ta/T1) of the plurality of two-dimensional images,
subtract an acquisition following inversion from acquisition without inversion to yield a signal that has a multiplicative T1 component which is independent of the plurality TSLs and is constant for a fixed timing between magnetization preparation and image acquisition, and
a generator of a quantitative T1ρ map from the multi-slice acquisitions of T1ρ-weighted data without retrospective correction for a contaminating effect of other MR relaxation parameters,
wherein the system improves quantitative accuracy of multi-slice imaging.

12. The system of claim 11, wherein the generator of the quantitative T1ρ map further comprises:
a generator of the quantitative T1ρ map that combines the multi-slice acquisitions of T1ρ-weighted data.

13. The system of claim 11, wherein the contaminating effect of other MR relaxation parameters further comprises:
a T2ρ relaxation parameter.

14. The system of claim 11, wherein the contaminating effect of other MR relaxation parameters further comprises:
a T1 relaxation parameter.

15. The system of claim 11, wherein the plurality of two-dimensional magnetic resonance images further comprises:
a plurality of two-dimensional anatomical images.

16. The system of claim 11, wherein the plurality of two-dimensional images further comprises:
a plurality of two-dimensional images of at least a portion of human cartilage.

17. The system of claim 11, wherein the generator of multi-slice acquisitions acquires $M_z(t_a)(1)$ interleaved with acquisitions of $M_z(t_a)(2)$.

18. The system of claim 11, wherein $M_z(t_a)(1)$ and $M_z(t_a)(2)$ are combined in k-space prior to Fourier transformation of $M_z(t_a)(1)$ and $M_z(t_a)(2)$ and magnitude calculations on $M_z(t_a)(1)$ and $M_z(t_a)(2)$.

19. The system of claim 11, wherein the wherein the generator of multi-slice acquisitions calculates a fit from the T1ρ maps, yielding quantitative T1ρ maps without retrospective correction for T1 or T2ρ contamination.

20. The system of claim 11, wherein the sequence of two-dimensional magnetic resonance images further comprises:
a sequence of two-dimensional magnetic resonance images of at least a portion of a human breast.

* * * * *